United States Patent [19]

Sood

[11] Patent Number: 4,612,461
[45] Date of Patent: Sep. 16, 1986

[54] HIGH SPEED INPUT BUFFER HAVING SUBSTRATE BIASING TO INCREASE THE TRANSISTOR THRESHOLD VOLTAGE FOR LEVEL SHIFTING

[75] Inventor: Lal C. Sood, Austin, Tex.

[73] Assignee: Motorola, Inc., Schaumburg, Ill.

[21] Appl. No.: 578,718

[22] Filed: Feb. 9, 1984

[51] Int. Cl.[4] .................... H03K 17/30; H03K 19/096
[52] U.S. Cl. ................................... 307/475; 307/443;
307/452; 307/362; 307/296 R
[58] Field of Search ............ 307/200 B, 443, 450–452,
307/475, 362, 363, 576, 579, 585, 296 R, 297,
304; 357/42

[56] References Cited

U.S. PATENT DOCUMENTS

| | | | |
|---|---|---|---|
| 4,233,672 | 11/1980 | Suzuki et al. | 357/42 X |
| 4,300,061 | 11/1981 | Mihalich et al. | 357/42 X |
| 4,384,300 | 5/1983 | Iizuka | 357/42 |
| 4,430,582 | 2/1984 | Bose et al. | 307/297 |
| 4,435,652 | 3/1984 | Stevens | 307/297 |
| 4,501,978 | 2/1985 | Gentile et al. | 307/475 |

FOREIGN PATENT DOCUMENTS

| | | | |
|---|---|---|---|
| 0046504 | 4/1980 | Japan | 357/42 |
| 0091861 | 7/1980 | Japan | 357/42 |

OTHER PUBLICATIONS

Mead & Conway, *Introduction to VLSI Systems*, Addison-Wesley Pub. Co. Reading, Mass, 1980 pp. 18–20.

Primary Examiner—Stanley D. Miller
Assistant Examiner—D. R. Hudspeth
Attorney, Agent, or Firm—Anthony J. Sarli, Jr.; Jeffrey V. Myers; James L. Clingan, Jr.

[57] ABSTRACT

An input buffer which can be used as a TTL to CMOS input buffer in a CMOS integrated circuit has a CMOS input inverter for receiving an external input signal. The typical threshold voltage of the P and N channel transistors is relatively low for high speed operation. At least one of the P and N channel transistors of the input inverter has the magnitude of its threshold voltage increased by applying appropriate back bias voltage in the well in which it resides.

5 Claims, 4 Drawing Figures

HIGH SPEED INPUT BUFFER HAVING SUBSTRATE BIASING TO INCREASE THE TRANSISTOR THRESHOLD VOLTAGE FOR LEVEL SHIFTING

FIELD OF THE INVENTION

The invention relates to high speed input buffers, and more particularly, to high speed input buffers in which input levels may not correspond to power supply levels.

BACKGROUND OF THE INVENTION

A typical CMOS input stage is a conventional CMOS inverter which has a P channel and a N channel transistor in series between the positive and negative power supply terminals with the gates connected together to receive an input signal. When a CMOS integrated circuit is designed to receive TTL signals, the part must meet predetermined current and speed considerations for worst case TTL input conditions. A TTL signal may have a logic low with a voltage level as high as 0.8 volt. For high speed operation the CMOS transistors, both P and N, will have a threshold voltage of a magnitude significantly less than 0.8 volt, for example 0.5 volt. Consequently, the N channel transistor may be undesirably conducting even when the input signal is a logic low. This is an unwanted current drain. Conversely, the input signal may be a logic high with a voltage of only 2.0 volts. Because the supply voltage is typically about 5 volts, the input P channel device will be undesirably conducting, also causing an unwanted current drain. Consequently, the input N channel and P channel transistors must be sufficently large not only to charge and discharge the capacitance of the output node to obtain the desired speed but also large enough to handle the current undesirably supplied by the transistor which desirably would be non-conducting.

SUMMARY OF THE INVENTION

An object of the invention is to provide an improved high speed input buffer.

Another object of the invention is to provide a high speed input buffer with improved speed.

Yet another object of the invention is to provide a high speed input buffer with reduced current drain.

These and other objects of the present invention are achieved in an integrated circuit in which the typical transistor has a relatively low threshold voltage for purposes of obtaining high speed operation. An input buffer for receiving signals external from the integrated circuit has a CMOS inverter comprised of a P channel and an N channel transistor, series connected. At least one of these P and N channel transistors has its threshold voltage increased in magnitude by receiving a back bias voltage different from that received by the typical low threshold voltage devices.

DESCRIPTION OF THE INVENTION

Figure 1:
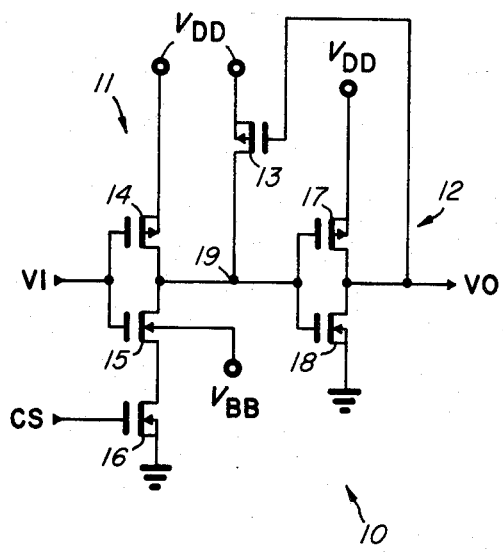
FIG. 1 is a circuit diagram of a high speed input buffer according to a first embodiment of the invention.

Shown in FIG. 1 is an input buffer 10 comprised generally of a clocked inverter 11, an inverter 12, and a latching P channel transistor 13. Inverter 11 is comprised of a P channel transistor 14, an N channel transistor 15, and an N channel transistor 16. Inverter 12 is comprised of a P channel transistor 17 and an N channel transistor 18. All of the transistors are enhancement mode insulated gate field effect transistors. P channel transistors 13, 14, and 17 have a threshold voltage of −0.4 to −0.6 volt. N channel transistors 16 and 18 have a threshold voltage of 0.4 to 0.6. Transistor 15 has a threshold voltage of 1.4 to 1.6 volt due to a special back bias voltage.

Transistor 14 has a source connected to a power supply terminal VDD for receiving a positive voltage of, for example, 5 volts, a gate for receiving an input signal VI, and a drain connected to a node 19 which serves as an output of inverter 11. Transistor 15 has a drain connected to node 19, a gate connected to the gate of transistor 14 for receiving signal VI, and a source. Transistor 16 has a drain connected to the source of transistor 15, a source connected to ground, and a gate for receiving a chip select signal CS. Transistor 17 has a source connected to VDD, a gate connected to node 19, and a drain for providing output signal VO. Transistor 18 has a drain connected to the drain of transistor 17, a gate connected to node 19, and a source connected to ground. Transistor 13 has a source connected to VDD, a gate connected to the drain of transistor 17, and a drain connected to node 19.

In operation which is responsive to signal VI, signal CS is a logic high so that transistor 16 is conducting. Inverter 11 provides an output on node 19 of a logic state complementary to that of the logic state of signal VI. Inverter 12 then provides signal VO at logic state complementary to that at node 19. When signal CS is a logic low, transistor 16 is non-conducting so that inverter 11 is no longer responsive to signal VI. In such case transistor 13 is useful for preventing leakage at node 19 from causing the logic state at node 19 to drop to a logic low. When node 19 is at a logic low at the time signal CS switches to a logic low, transistor 13 will be non-conducting due to signal VO being at a logic high so that the logic low at node 19 will be undisturbed.

Signal VI can be as high as 0.8 volt for a logic low. With transistor 15 having a threshold voltage of 1.4 to 1.6 volt, transistor 15 is ensured of being non-conducting. Transistor 14 is conducting and causes node 19 to reach the voltage at VDD. With node 19 at the voltage at VDD, transistor 17 is ensured of being non-conducting. Consequently, there is no current path between VDD and ground through either inverter 11 or 12. This is the desired result. If transistor 15 had a threshold voltage of 0.4 to 0.6 as do the other transistors, transistor 15 would conduct current when signal VI is at 0.8 volt. That transistor 15 is not conducting when signal VI is at 0.8 volt, however, is advantageous not only in eliminating current drain through inverter 11 under this condition but also in improving speed. There is capacitance at node 19 which must be charged in order for node 19 to switch from a logic low to a logic high. The current supplied by transistor 14 will be applied to charging node 19 because transistor 15 will not cause any current drain. Consequently, node 19 will rise in voltage at a faster rate than if transistor 15 were conducting.

Transistor 14 has a gain which is selected to obtain the speed which is desired. Because channel length is normally fixed at or near the minimum allowed by the particular process, increase in gain means increase in channel width which in turn means an increase in size. Consequently, with transistor 15 ensured of not conducting, transistor 14 can be reduced in size, saving chip area, to obtain the same speed as that if transistor 15 were not non-conducting.

That transistor 15 is not conducting can thus be used, in addition to reducing current drain, for either increasing speed or reducing chip area or a combination of the two.

Transistor 15 is conveniently increased in voltage beyond that of other N channel transistors by selective application of back bias. In FIG. 1 transistor 15 is shown as having its channel or well biased by a voltage VBB. Shown in FIG. 2, in simplified form, is a conventional N channel transistor 20, shown in cross-section, fabricated in an N-type substrate 21. Transistor 20 has source/drain regions 22 and 23 in a P-well 24, and a gate 25 overlying an insulator 26. In such a configuration, substrate 21 will be at the voltage present at VDD, 5 volts, in the present example. P-wells, such as P-well 24 will typically be at the negative power supply voltage, ground potential in the present example. Consequently, the P-N junction between substrate 21 and P-well 24 is reverse biased. Transistor 20 can easily have its threshold voltage increased with back bias by applying a more negative voltage applied to P-well 24. That an N channel transistor can have its threshold voltage increased with back bias in this manner is well known. Additionally, techniques for generating such a negative voltage for back biasing N channel transistors are well known. A conductor 27 is easily fabricated to be in contact with P-well 24, using conventional techniques, for coupling the generated negative voltage to P-well 24. Conductor 27 is shown as being insulated from other areas by insulating layer 28. Although other appropriate materials could be used, in a preferred embodiment substrate 21 is monocrystalline silicon, insulator 26 and insulating layer 28 are silicon oxide, gate 25 is polycrystalline silicon, and conductor 27 is polycrystalline silicon or metal.

This reverse bias technique is selective in that the threshold voltage of transistors in other P wells is unaffected by the application of a negative voltage to P-well 24. The P-N junction between substrate 21 and P-well 24 is simply more reverse biased than the P-N junctions formed between substrate 21 and other P-wells (not shown). Consequently, the high speed performance of the other circuitry facilitated by low threshold voltages is not compromised by increasing the threshold voltage of transistor 15 to improve the input buffering performance of inverter 11.

As gate lengths continue to decrease, now in the one micron range, the effect of back bias on threshold voltage of $-2.5$ volts of back bias can cause an increase in threshold voltage of 1.0 volt over the threshold voltage of an N channel transistor in a grounded P-well. Such an increase certainly ensures that the transistor 15 will not be conducting when a logic low of 0.8 volt is received. With modern circuit modeling techniques the amount of back bias to obtain the desired change in threshold voltage is easily found.

Figure 3:
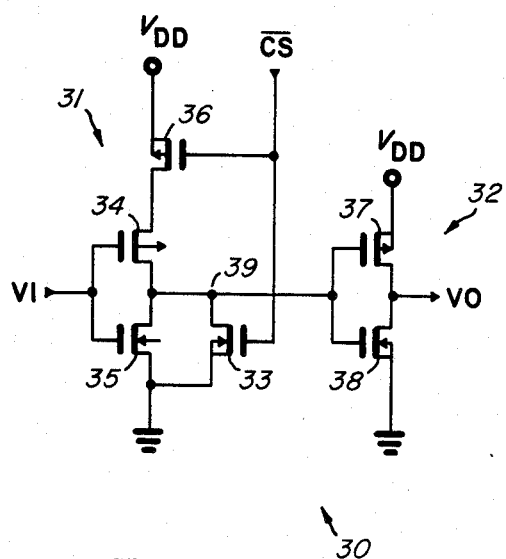
FIG. 3 is a circuit diagram of a high speed input buffer according to a second embodiment of the invention.

Shown in FIG. 3 is an input buffer 30 comprised generally of a clocked inverter 31, an inverter 32, and a clamping N channel transistor 33. Inverter 31 is comprised of P channel transistor 34, N channel transistor 35, and P channel transistor 36. Inverter 32 is comprised of a P channel transistor 37 and an N channel transistor 38. All of the transistors 33–38 are enhancement mode insulated gate field effect transistors.

Transistor 36 has a source connected to VDD, a gate for receiving a negated chip select signal CS, and a drain. Transistor 34 has a source connected to the drain of transistor 36, a drain connected to a node 39 which serves as an output of inverter 31, and a gate for receiving input signal VI. Transistor 35 has a drain connected to node 39, a source connected to ground, and a gate connected to the gate of transistor 34 for receiving signal VI. Transistor 33 has a drain connected to node 39, a gate for receiving negated signal CS, and a source connected to ground. Transistor 37 has a source connected to VDD, a gate connected to node 39, and a drain for providing output signal VO. Transistor 38 has a drain connected to the drain of transistor 37, a gate connected to node 39, and a source connected to ground.

The operation of buffer 30 is substantially the same as that of buffer 10 of FIG. 1. When the chip is selected, signal CS is a logic high and negated signal CS is a logic low so that transistor 36 is conducting and transistor 33 is non-conducting. Inverter 31 then provides the logic state to node 39 which is complementary to the logic state of signal VI. Inverter 32 in turn provides signal VO at the logic state complementary to that present at node 39. Except during the transition between logic states, node 39 is at or near the voltage at VDD so that transistor 37 is not conducting, or is at or near ground potential so that transistor 38 is not conducting. When the chip is not selected, transister 36 is not conducting and transistor 33 is conducting. Transistor 36 thereby disables inverter 31 from responding to signal VI, and transistor 33 clamps node 39 to ground so that signal VO is provided at a logic high whenever the chip is not selected. This operation differs from buffer 10 of FIG. 1 in that the input inverter 31 is clocked by a P channel transistor, transistor 36, instead of an N channel transistor, and signal VO is held at a logic high by the operation of transistor 33 when the chip is deselected instead of being latched at the previous logic state by virtue of the operation of transistor 13.

The current drain problem related to receiving TTL signals, however, remains. As in the case of buffer 10 of FIG. 1, it is desirable in buffer 30 for P channel transistor 34 to be non-conducting when signal VI is a logic high and for N channel transistor 35 to be non-conducting when signal VI is a logic low. Using the technique described in FIGS. 1 and 2, transistor 35 can have its threshold voltage increased to avoid becoming conductive when signal VI is at a logic low of 0.8 volt.

Another alternative is to increase the threshold voltage of transistor 34 to have improved performance for the case of signal VI switching to a logic high. When signal VI switches to a logic high which may only be 2.0 volts, transistor 35 must pull node 39 to a voltage at or near ground. This can be achieved more quickly if transistor 34 is not supplying current, or even supplying a reduced amount of current. This can be achieved by increasing the magnitude of the threshold voltage of transistor 34. The threshold voltage, in order to be completely non-conductive, must be increased in magnitude to be at least the voltage at VDD minus the voltage of signal VI for the lowest voltage which is still a logic high, 2.0 volts in the present example. If the voltage at VDD is 5.0 volts, then the magnitude of the threshold voltage must be at least 5.0 minus 2.0 which is 3.0 volts. A lesser increase will still provide some benefit.

Figure 2:
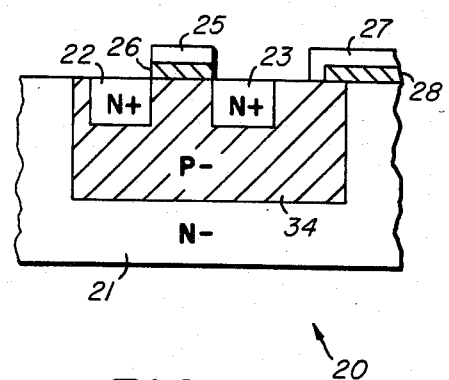
FIG. 2 is a simplified cross section of a transistor useful in understanding the circuit of FIG. 1.
Figure 4:
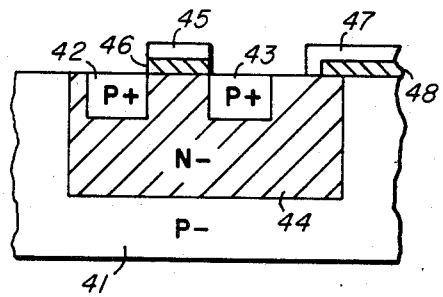
FIG. 4 is a simplified cross section of a transistor useful in understanding the circuit of FIG. 3.

It was shown in FIG. 2 that an N channel transistor in an N-type substrate can have its threshold voltage selectively increased quite conveniently. Shown in FIG. 4, in simplified form, is a P channel transistor 40, shown in cross-section, fabricated in a P-type substrate 41. Transistor 40 has source/drain regions 42 and 43, in an N-well 44, and a gate 45 overlying an insulator 46. In such a configuration, substrate 41 will be at the negative power supply voltage, in the present example, ground, or at some other separately generated negative voltage, N-wells such as N-well 44 will typically be at the voltage present at VDD, 5 volts in the present case. Consequently, the PN junction between substrate 41 and N-well 44 will be reverse biased. Transistor 40 can easily have the magnitude of its threshold voltage increased with back bias by applying more voltage to N-well 44. Just as for transistor 20 of FIG. 2, transistor 40 can thus selectively have the magnitude of its threshold voltage increased while not affecting the threshold voltage of transistors in other N-wells. A conductor 47, in contact with N-well 44 and overlying an insulating layer 48, is for coupling the higher voltage to N-well 44. The higher voltage can be generated from well known pumping techniques. An example of such techniques in current use is on single power supply EEPROMs in which the high voltage programming signal is internally generated.

For a given CMOS device typically only the P channel transistors or the N channel transistors, but not both P and N channel, are available to be selectively increased in threshold voltage. For example in FIG. 2, separate N-wells might be created for the P channel transistors but these N-wells would be in the N-type substrate 21 and would not be able to have a different voltage than that of the substrate because there would be no reverse biased PN junction therebetween. The same is true for P-wells formed in P-type substrate 41 shown in FIG. 4. Even if P-wells for the N channel transistors were created, such P-wells could only be at the same voltage as substrate 41. It is forseeable, however, that with various epitaxial and implanting techniques finding widespread use, that a practical process could be developed in which both P-wells and N-wells could be electrically isolated from the substrate. In such a case both P and N channel transistors could be selectively increased in threshold voltage by the convenient technique described for improving input buffer performance.

While the invention has been described in preferred embodiments, it will be apparent to those skilled in the art that the disclosed invention may be modified in numerous ways and assume many embodiments other than those specifically set out and described above. Accordingly, it is intended by the appended claims to cover all modifications of the invention which fall within the true spirit and scope of the invention.

I claim:

1. In a CMOS integrated circuit in which N channel transistors are formed in P-wells at least one of which has means for receiving a back bias of a first voltage, an input buffer comprising:

a first P channel transistor having a first current electrode coupled to a first power supply terminal, a control electrode for receiving an input signal generated externally from the CMOS integrated circuit, and second current electrode;

a first N channel transistor, formed in a P-well having means for receiving a back bias of a second voltage which is more negative than the first voltage, having a first current electrode coupled to the second current electrode of the first P channel transistor, a control electrode for receiving the input signal, and a second current electrode coupled to a second power supply terminal;

a second P channel transistor having a first current electrode coupled to the first power supply terminal, a control electrode coupled to the second current electrode of the first P channel transistor, and a second current electrode for providing an output signal; and a second N channel transistor, formed in a P-well having means for receiving the back bias of the first voltage, having a first current electrode coupled to the second current electrode of the second power supply terminal, a control electrode coupled to the control electrode of the second P channel transistor, and a second current electrode coupled to the second power supply terminal.

2. The input buffer of claim 1, wherein the second P channel transistor has a negative threshold voltage of a first magnitude and the first P channel has a negative threshold voltage of a magnitude greater than that of the second P channel transistor.

3. In a CMOS integrated circuit in which enhancement mode transistors of a first conductivity type are formed in wells of a second conductivity type, the wells having means for receiving a back bias, and at least one of the enhancement mode transistors of the first conductiviTY type has a first threshold voltage in response to a back bias of a first voltage, an input buffer, comprising:

a first transistor of the second conductivity type having a first current electrode coupled to a first power supply terminal, a control electrode for receiving an input signal generated externally from the CMOS integrated circuit, and a second current electrode;

a second transistor of the first conductivity type formed in a well of the second conductivity type having means for receiving a back bias of a second voltage selected to increase the threshold voltage to a magnitude greater than that of said first threshold voltage, having a first current electrode coupled to the second current electrode of the first input transistor, a control electrode for receiving the input signal, and a second current electrode coupled to a second power supply terminal;

a third transistor of the second conductivity type having a first current electrode coupled to a first power supply terminal, a control electrode coupled to the second current electrode of the first transistor, and a second current electrode for providing an output signal; and a fourth transistor of the first conductivity type having a first current electrode coupled to the second power supply terminal, a control electrode coupled to the control electrode of the third transistor, a second current electrode coupled to the second current electrode of the third transistor, said fourth transistor characterized as having the first threshold voltage.

4. In a CMOS integrated circuit having an input buffer which has a first inverter for receiving a signal generated externally from the integrated circuit comprised of a first transistor of a first conductivity type and a second transistor of a second conductivity type, and a second inverter coupled to the first inverter comprised of a third transistor of the first conductivity type and a fourth transistor of the second conductivity type, wherein the first and third transistors each have channel regions formed in an area of the second conductivity type and the second and fourth transistors have channel regions formed in an area of the first conductivity type, a method for reducing leakage current through the input buffer, comprising the steps of:

biasing the channel region of the third transistor to a first voltage which causes the third transistor to have a threshold voltage of a first magnitude; and biasing the channel region of the first transistor to a second voltage greater in magnitude than that of the first voltage which causes the first transistor to have a threshold voltage of a magnitude greater than that of the third transistor.

5. The method of claim 4 further comprising the steps of:

biasing the channel region of the fourth transistor to a third voltage which causes the fourth transistor to have a threshold voltage of a second magnitude; and biasing the channel region of the second transistor to a fourth voltage greater in magnitude than that of the third voltage which causes the third transistor to have a threshold voltage of a magnitude greater than that of the fourth transistor.

* * * * *